US009927726B2

(12) United States Patent
Tinnemans et al.

(10) Patent No.: US 9,927,726 B2
(45) Date of Patent: Mar. 27, 2018

(54) POLARIZATION INDEPENDENT INTERFEROMETER

(71) Applicants: ASML Netherlands B.V., Veldhoven (NL); ASML Holding N.V., Veldhoven (NL)

(72) Inventors: Patricius Aloysius Jacobus Tinnemans, Veldhoven (NL); Arie Jeffrey Den Boef, Veldhoven (NL); Justin Lloyd Kreuzer, Wilton, CT (US); Simon Gijsbert Josephus Mathijssen, Veldhoven (NL)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 0 days.

(21) Appl. No.: 15/023,075

(22) PCT Filed: Sep. 11, 2014

(86) PCT No.: PCT/EP2014/069412
§ 371 (c)(1),
(2) Date: Mar. 18, 2016

(87) PCT Pub. No.: WO2015/051970
PCT Pub. Date: Apr. 16, 2015

(65) Prior Publication Data
US 2016/0223920 A1  Aug. 4, 2016

Related U.S. Application Data

(60) Provisional application No. 61/888,803, filed on Oct. 9, 2013.

(51) Int. Cl.
*G01B 11/00* (2006.01)
*G03F 9/00* (2006.01)
(Continued)

(52) U.S. Cl.
CPC ........ *G03F 9/7069* (2013.01); *G01B 9/02011* (2013.01); *G01B 9/02015* (2013.01);
(Continued)

(58) Field of Classification Search
CPC ............................ G01B 9/02015; G01B 11/14; G01B 2290/70; G01B 9/02027; G01B 9/02091;
(Continued)

(56) References Cited

U.S. PATENT DOCUMENTS 6,297,876 B1   10/2001   Bornebroek
6,961,116 B2   11/2005   Den Boef et al.
(Continued)

FOREIGN PATENT DOCUMENTS

CN   102890433 A   1/2013
JP   S61-134021    6/1986
(Continued)

OTHER PUBLICATIONS

Written Opinion of the International Search Authority with Search Report directed to App. No. PCT/EP2014/069412, dated Jan. 9, 2015; 11 pages.
(Continued)

*Primary Examiner* — Mesfin Asfaw
(74) *Attorney, Agent, or Firm* — Sterne, Kessler, Goldstein & Fox P.L.L.C.

(57) ABSTRACT

Apparatus, systems, and methods are used for detecting the alignment of a feature on a substrate using a polarization independent interferometer. The apparatus, system, and methods include optical elements that receive light that has diffracted or scattered from a mark on a substrate. The optical elements may split the diffracted light into multiple subbeams of light which are detected by one or more detectors. The diffracted light may be combined optically or during processing after detection. The system may deter-
(Continued)

mine alignment and/or overlay based on the received diffracted light having any polarization angle or state.

17 Claims, 11 Drawing Sheets

(51) Int. Cl.
  *G01B 9/02* (2006.01)
  *G01B 11/27* (2006.01)
(52) U.S. Cl.
  CPC .......... *G01B 11/272* (2013.01); *G03F 9/7049* (2013.01); *G03F 9/7088* (2013.01); *G01B 2290/70* (2013.01)
(58) Field of Classification Search
  CPC ... G01B 11/161; G01B 11/2441; G01B 11/27; G01B 9/02028; G01B 9/02044; G01B 9/0209; G01B 11/02; G01B 11/164; G01B 2290/30; G01B 2290/45; G01B 2290/60; G01B 9/02007
  See application file for complete search history.

(56) References Cited

U.S. PATENT DOCUMENTS

| | | |
|---|---|---|
| 7,345,739 B2 | 3/2008 | Hendriks et al. |
| 7,701,577 B2 | 4/2010 | Straaijer et al. |
| 9,303,978 B2 | 4/2016 | Den Boef |
| 2005/0012915 A1 | 1/2005 | Neijzen et al. |
| 2007/0127006 A1* | 6/2007 | Shibazaki ........... G03F 7/70341 355/72 |
| 2009/0027688 A1* | 1/2009 | Pouet ................. G01N 29/2418 356/502 |
| 2009/0153825 A1 | 6/2009 | Edart et al. |
| 2009/0195768 A1 | 8/2009 | Bijnen et al. |
| 2012/0057171 A1* | 3/2012 | Khuat Duy ........... G03F 9/7049 356/494 |

FOREIGN PATENT DOCUMENTS

| | | |
|---|---|---|
| JP | H06-207808 | 7/1994 |
| JP | 2000-146525 A | 5/2000 |
| JP | 2008-244448 A | 10/2008 |
| KR | 100623260 B1 | 9/2006 |
| KR | 1020120095317 A | 8/2012 |
| WO | WO 2015/051970 A1 | 4/2015 |

OTHER PUBLICATIONS

English-language Abstract of Chinese Patent Publication No. CN 102890433 A, published Jan. 23, 2013; 1 page.
International Preliminary Report on Patentability directed to related International Patent Application No. PCT/EP2014/069412, dated Apr. 12, 2016; 9 pages.
Korean Written Decision on Registration with English-language machine translation attached, dated Jan. 30, 2018; 2 pages.

* cited by examiner

POLARIZATION INDEPENDENT INTERFEROMETER

CROSS-REFERENCE TO RELATED APPLICATIONS

This application claims the benefit of U.S. provisional application 61/888,803, which was filed on Oct. 9, 2013, and which is incorporated herein in its entirety by reference.

FIELD

The present disclosure relates to an alignment sensor and alignment method, such as that used in a lithographic process.

RELATED ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Typically, an alignment mark is provided on the substrate to accurately position features formed on the substrate. An alignment sensor measures the mark, for example the position of the alignment mark or the shape of the alignment mark. The measurement may also generate information on process variations (for example layer thickness variations, layer permittivity variations, focus variations, dose variations, etc.). The lithographic apparatus uses the measurement to accurately position the features. Depending on the sensor, X, Y measurements are either made together or separately. In one example, a self-referencing interferometer can be used in the alignment sensor.

Another alignment technique comprises illuminating the alignment mark and obtaining an interference pattern from the higher/non-zeroth diffractive orders (for example the +1st and −1st diffractive orders), with the 0th order being blocked. This is sometimes referred to as dark field detection. But the 1st order diffraction efficiency decreases as the alignment mark contrast decreases, i.e., the 1st order signals are increasingly weaker. In addition, the polarization of the higher/non-zeroth diffractive orders (for example, the +1st and −1st diffractive orders) must be polarized at a 45 degree orientation in order to create two images of equal intensity from the diffracted radiation.

SUMMARY

It is desirable to provide an alignment sensor that measures diffracted radiation having any polarization angle and/or state, i.e., polarization independent.

In one embodiment, a lithographic apparatus includes an illumination system configured to condition a radiation beam, a substrate table configured to hold a substrate that has a mark, and a projection system configured to project the radiation beam onto the substrate. The lithographic apparatus also includes an optical system configured to receive a diffracted or scattered radiation beam from the mark having any polarization along an optical path passing through the optical system and to output first and second beams. The optical system comprises an interferometeric sub-system located along the optical path. The interferometric subsystem comprises a beam splitter configured to split the diffracted or scattered radiation beam to form the first and second beams. The optical system also comprises a detector sub-system configured to detect respective first and second alignment signals containing information on a position of the mark based on the first and second beams.

In a further embodiment, an alignment sensor includes an optical system configured to receive a diffracted or scattered radiation beam having any polarization from a surface of a substrate along an optical path passing through the optical system and to output first and second composite beams. The optical system comprises an interferometric sub-system located along the optical path. The interferometric sub-system comprises a substantially non-polarizing beam splitter that does not affect polarization of the diffracted or scattered radiation beam. The non-polarizing type beam splitter is configured to split the diffracted or scattered radiation beam to form the first and second composite beams. The optical system also comprises a detector sub-system located along the optical path passing through the optical system. The detector sub-system is configured to detect respective first and second alignment signals containing information on the position of the mark based on the corresponding first and second composite beams.

In a still further embodiment, an alignment sensor includes an optical system configured to receive a diffracted or scattered radiation beam from a mark on a substrate having any polarization. The optical system comprises a first polarizing beam splitter configured to separate the diffracted or scattered radiation beam into a first polarized beam and a second polarized beam different than the first polarized beam. The optical system also comprises an interferometric sub-system located along an optical path passing through the optical system and configured to receive the first and second polarized beams and output respective first and second composite beams based on the corresponding first and second polarized beams. The optical system additionally comprises a detector sub-system located along the optical path passing through the optical system. The detector sub-system is configured to detect respective first and second alignment signals containing information on a position of the mark based on the first and second composite beams.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
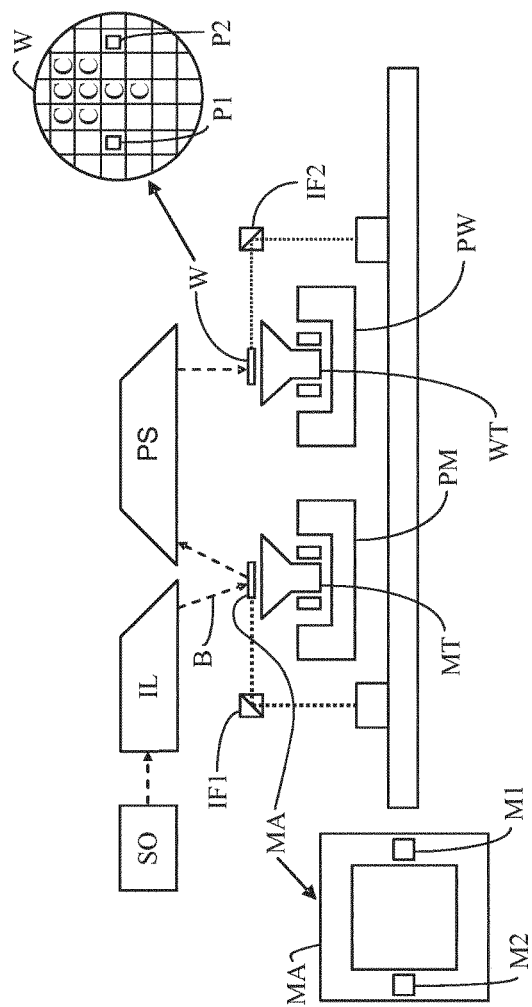
FIG. 1A is a schematic illustration of a reflective lithographic apparatus according to an embodiment of the invention.

The features and advantages of the present invention will become more apparent from the detailed description set forth below when taken in conjunction with the drawings. Generally, the drawing in which an element first appears is typically indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Example Reflective and Transmissive Lithographic Systems

Figure 1B:
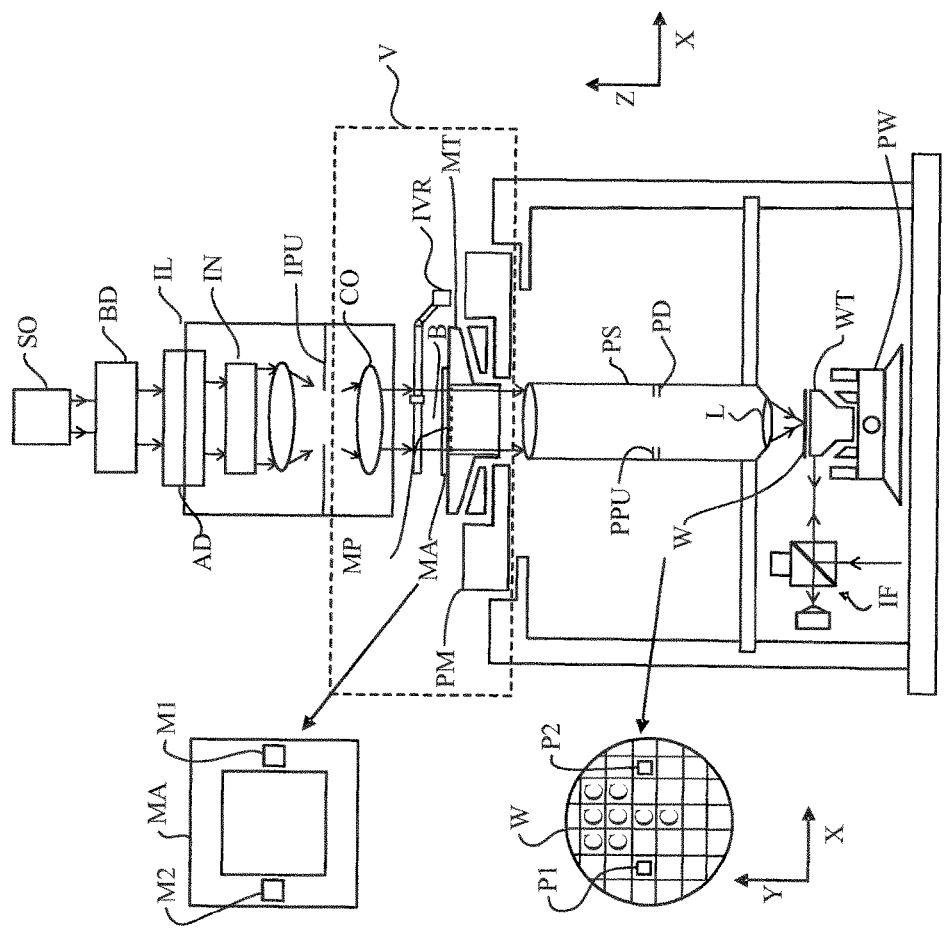
FIG. 1B is a schematic illustration of a transmissive lithographic apparatus according to an embodiment of the invention.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, DUV or EUV radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, magnetic, electromagnetic, electrostatic, or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. The support structure MT can ensure that the patterning device is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions.

The tilted mirrors impart a pattern in the radiation beam B which is reflected by the mirror matrix.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables (and/or two or more mask tables) WT. In such "multiple stage" machines, the additional substrate tables WT can be used in parallel, or preparatory steps can be carried out on one or more tables while one or more other substrate tables WT are being used for exposure.

Referring to FIGS. 1A and 1B, the illuminator IL receives a radiation beam from a radiation source SO. The source SO and the lithographic apparatuses 100, 100' can be separate entities, for example, when the source SO is an excimer laser. In such cases, the source SO is not considered to form part of the lithographic apparatuses 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatuses 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatuses 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to herein.

Combinations and/or variations on the described modes of use or entirely different modes of use can also be employed.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), and thin-film magnetic heads. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist), a metrology tool, and/or an inspection tool. Where applicable, the disclosure herein can be applied to such and other substrate processing tools. Further, the substrate can be processed more than once, for example, in order to create a multi-layer IC, so that the term substrate used herein can also refer to a substrate that already contains one or multiple processed layers.

In a further embodiment, lithographic apparatus 100 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including visible radiation (for example, having a wavelength $\lambda$ in the range of 400 to 780 nm), ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

Polarization Dependent Interferometers

Figure 2:
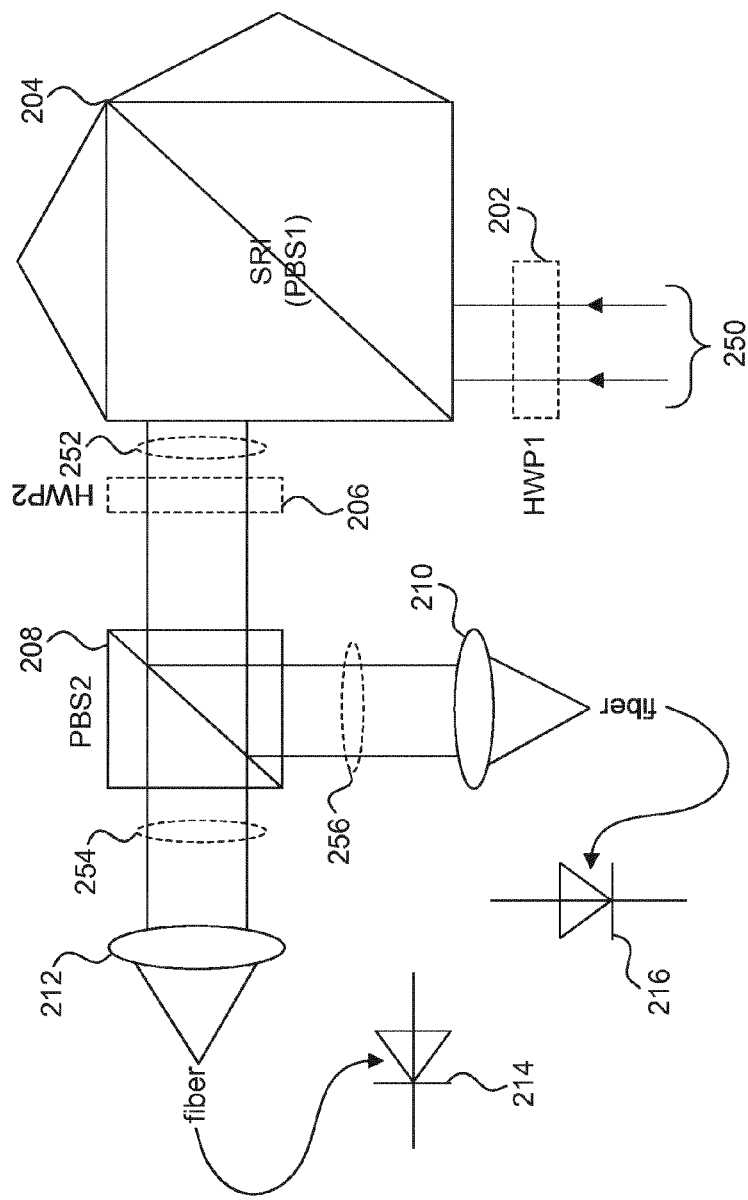
FIG. 2 is a schematic illustration of a system view of a polarization dependent interferometer with output optics.

FIG. 2 illustrates a schematic of a system view of a polarization dependent interferometer used for determining alignment and/or overlay. In one example, this data can be obtained with any type of alignment sensor, for example a SMASH (SMart Alignment Sensor Hybrid) sensor, as described in U.S. Pat. No. 6,961,116, incorporated by reference herein in its entirety. The '116 patent employs a self-referencing interferometer with a single detector and four different wavelengths, and extracts the alignment signal in software. Alternatively, each of seven (or more) diffraction orders may be directed to a dedicated detector, as described in U.S. Pat. No. 6,297,876, which is incorporated by reference herein in its entirety. Generally marks are measured separately to obtain X- and Y-positions. However, combined X- and Y-measurement can be performed using the techniques described in published patent application US 2009/195768, incorporated by reference herein in its entirety.

In FIG. 2, light is diffracted from a mark on a substrate, such as an alignment mark, as diffracted light 250. Diffracted light 250 can include multiple diffraction orders, for example the higher/non-zeroth diffractive orders (for example the +1st and −1st diffractive orders), with the 0th order blocked. The 0th order may be blocked to avoid degrading the depth of modulation available in a detected signal. The diffracted light 250 optionally first passes through a half-wave plate 202 before entering self-referencing interferometer 204. The self-referencing interferometer 204 may, for example, output two images of the diffracted light 250 that was input with a relative rotation of 180° and which overlap and can therefore be made to interfere.

In one example, the diffracted light 250 has to be at a 45 degree polarization in order to create two images that are detected with equal intensity. Half-wave plate 202 and half-wave plate 206 are optional to this end—when the self-referencing interferometer 204 and the polarizing beam splitter 208 are placed at a 45 degree angle from their position when the half-wave plates 202 and 206 are used, then the half-wave plates become unnecessary.

As shown in FIGS. 3A and 3B, the self-referencing interferometer 204 receives the diffracted light 250 at input 204.1. FIG. 3C depicts the diffracted light 250 entering the self-referencing interferometer 204 at input 204.1. Within the self-referencing interferometer 204, the diffracted light 250 is split into two channels AB and BA. Channel BA is shown in FIG. 3A and channel AB in FIG. 3B. The electric field of the output beams 252.1 and 252.2 which traverse the channels AB and BA may be characterized in terms of Jones matrices as depicted in equations 1 and 2:

$$E_{out,AB} = \underline{X}(90°) \cdot \begin{bmatrix} 1 & 0 \\ 0 & 0 \end{bmatrix} \cdot E_{in} \quad (1)$$

$$E_{out,BA} = \underline{X}(-90°) \cdot \begin{bmatrix} 0 & 0 \\ 0 & 1 \end{bmatrix} \cdot E_{in} \quad (2)$$

Where the counter-clockwise rotation matrix is depicted in equation 3:

$$\underline{\chi}(\chi) = \begin{bmatrix} \cos(\chi) & -\sin(\chi) \\ \sin(\chi) & \cos(\chi) \end{bmatrix} \quad (3)$$

Figure 3:
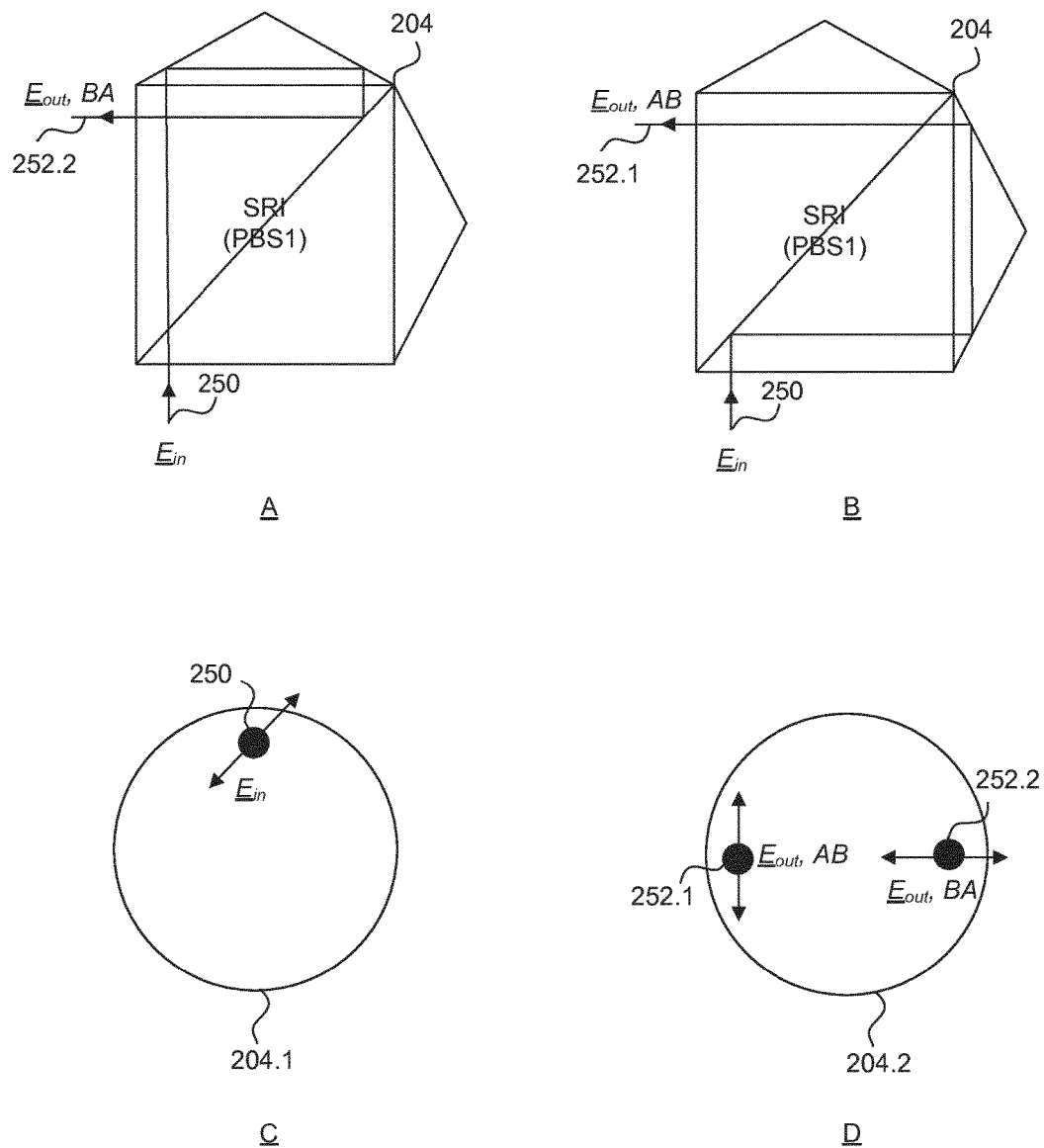
FIG. 3 is a schematic illustration of the polarization dependent interferometer including inputs and outputs.

The diffracted light 250, having traversed the self-referencing interferometer 204 via channels AB and BA, exits the self-referencing interferometer 204 at exit 204.2 as shown in FIG. 3D. FIG. 2 depicts the output beams 252.1 and 252.2 of FIG. 3 as the output beam 252. The self-referencing interferometer 204 splits the diffracted light 250 into spatially separate output beams 252.1 and 252.2 which are ideally at perpendicular polarization angles to each other. In FIG. 3C only one diffracted order resulting from the alignment mark is shown in order to simplify these figures. Only one diffraction order is insufficient for interference and hence modulation of the alignment signal (at the detector) to take place. Typically in FIG. 3C, for each positive higher diffraction order an accompanying negative higher diffraction order is present at the 180 degrees rotated location. This accompanying negative higher diffraction order will result in an additional pair of beams in FIG. 3D which at least partly overlap with the beams resulting from the accompanying positive higher diffraction order. The at least partly overlapping beams will result in interference, and hence an alignment mark position dependent (and also alignment mark shape dependent) modulation of the alignment signal.

If the self-referencing interferometer 204 is not rotated at a 45 degree angle, the output light 252 passes through half-wave plate 206 and reaches polarizing beam splitter 208. Polarizing beam splitter 208 splits the output light 252 into detection beams 254 and 256, which pass through optical elements 212 and 210, respectively. In an example, these optical elements may be lenses. For sake of simplicity of discussion, the optical elements will be referred to herein as lenses, though other types of optical elements may be used as will be recognized by those skilled in the relevant art(s). The lenses focus the light toward detectors 214 and 216, for example via optical fibers. The detectors 214 and 216 may be placed in a pupil plane, image plane, or in a location between the pupil and image plane, where the different diffraction orders interfere. The detected interfered diffraction orders provide positional information.

In one example, this configuration is limited by the requirement that the diffracted light 250 have a specific polarization in order to ensure a sufficiently high signal-to-noise (SNR) ratio. For example, sub-segmented marks on the substrate may act as a polarizer, causing the polarization of the diffracted light 250 to be different than the polarization of the original incident light upon the substrate. This change in polarization causes a target/wavelength dependent contrast loss. Thus, unless the diffraction orders of the diffracted light 250 have the specific polarization, there will be a resultant loss of contrast, such as a reduced depth of modulation, in the detected signals.

Exemplary Embodiments of Polarization Independent Interferometers

Figure 4:
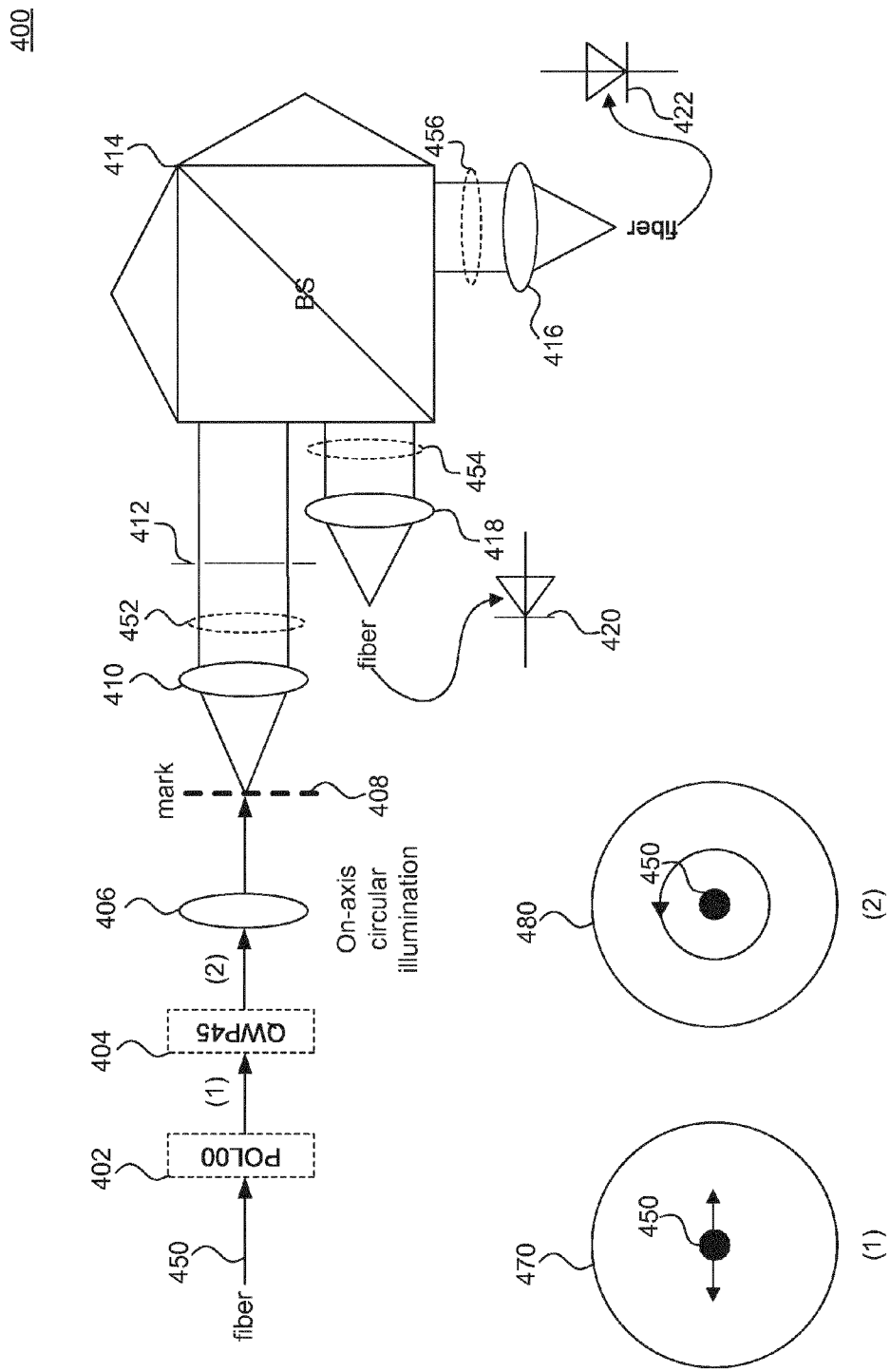
FIG. 4 is a schematic illustration of a polarization independent interferometer according to a first embodiment of the invention.

FIG. 4 illustrates a schematic illustration of a polarization independent interferometer system 400 according to a first embodiment. In other words, system 400 does not require a certain polarization to accurately determine alignment and/or overlay. FIG. 4 schematically depicts the light path between a light source and a detector via a diffraction mark. Although shown as a transmissive diffraction grating 408, those skilled in the relevant art(s) will appreciate that the system 400 may use a reflective diffraction grating. For simplicity of discussion, this will be referred to herein as mark 408.

A beam of radiation 450 is emitted toward the surface of the substrate on which the mark 408 exists. The beam of radiation 450 may be delivered via a fiber optic cable from a light source, such as radiation source SO depicted in FIG. 1A or 1B. In one embodiment, the beam of radiation 450 passes through a polarizer 402 and a quarter-wave plate 404, which impart a particular polarization on the beam of radiation. For example, after passing through the polarizer 402, the beam of radiation 450 may have a linear polarization as shown in field 470. In one example, after passing through the quarter-wave plate 404, the beam of radiation 450 may be circularly polarized as shown in field 480. The use of one or both of the polarizer 402 and the quarter-wave plate 404 imparts a uniform polarization allowing alignment marks with an arbitrary rotation to be similarly measured. In embodiments, the polarizer 402 and quarter-wave plate 404 are optional. In the examples discussed, the beam of radiation 450 has polarization of any state without loss of contrast. The polarization could be linearly polarized (at 0 degrees, 45 degrees, or 90 degrees), circular polarized, elliptical polarized, un-polarized, or partially polarized, just to name a few non-limiting examples.

In one example, beam of radiation 450 passes through optics 406. Optics 406 can be, but is not limited to, a single lens or the projection system PS. The optics 406 operate to focus the beam of radiation 450 onto one or more portions of the substrate that includes the mark 408. The beam of radiation 450 may be on-axis (for example, ideally parallel to the normal of the alignment mark surface) or off-axis illumination, as will be understood by those skilled in the relevant art(s).

In one example, the beam of radiation 450 diffracts from the mark 408 as diffracted light 452. As discussed above with respect to FIG. 2, diffracted light 452 may include multiple diffraction orders, such as the higher/non-zeroth diffractive orders (for example the +1st and −1st diffractive orders), of any polarization or state. This may include, for example, elliptically polarized light, linearly polarized light, circularly polarized light, partially polarized light, or unpolarized light. The 0th order may be blocked to prevent interference with the depth of modulation of any detected signal, such as by stop 412 which only allows the diffracted light 452 that composes the higher/non-zeroth diffractive orders (for example the +1st and −1st diffractive orders). The diffracted light 452 may then enter optics 410.

In an embodiment, the optics 406 and the optics 410 are the same lens and/or system, while in other embodiments the optics 406 and 410 may be separate elements within an overall system or combination of systems.

Figure 5:
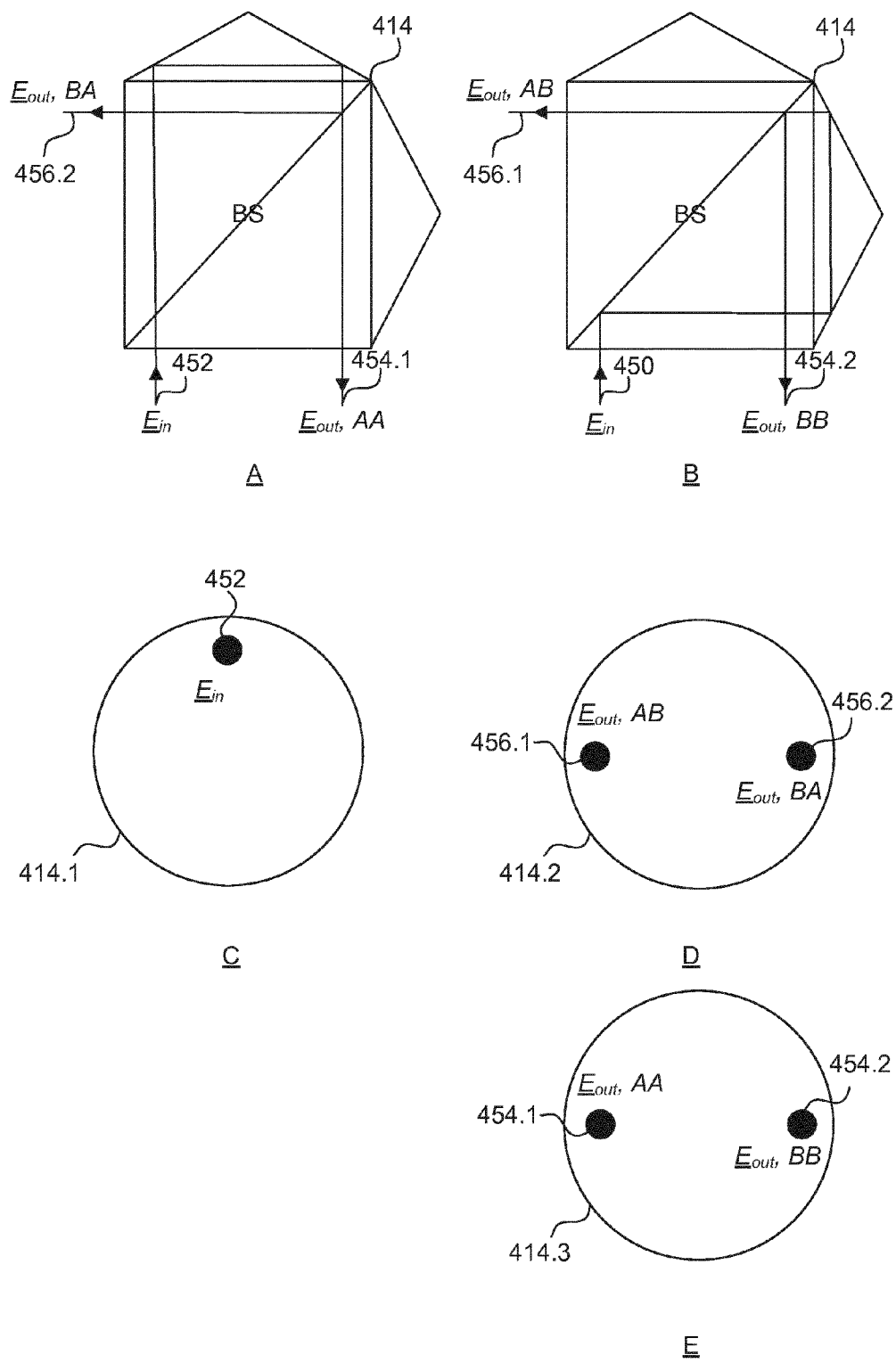
FIG. 5 is a schematic illustration of the polarization independent interferometer according to the first embodiment of the invention including inputs and outputs.

In one example, diffracted light 452 enters a self-referencing interferometer 414, for example built upon a polarization neutral beam splitter. In an embodiment, the self-referencing interferometer 414 may be a 50/50 beam splitter. As shown in FIGS. 5A and 5B, the self-referencing interferometer 414 receives the diffracted light 452 at an input 414.1. FIG. 5C also depicts one of the beams of the diffracted light 452 entering the self-referencing interferometer 414 at input 414.1 (note that other beams of diffracted light are omitted here for the sake of simplicity and understanding of the corresponding figures). The diffracted light 452 may be, for example, the higher/non-zeroth diffractive orders (for example the +1st and −1st diffractive orders) in a 180° rotationally symmetric configuration. Within the self-referencing interferometer 414, the diffracted light 452 may be split into four channels AB, BA, AA, and BB. Internal reflections within the self-referencing interferometer 414 may cause the diffracted light 452 to split in different combinations before exiting one of outputs 414.2 and 414.3 shown in FIGS. 5D and 5E. Note that the self-referencing interferometer 414's assembly consists of one beam splitter (for example of the neutral density or polarizing type) and two rotation prisms. Note that in FIGS. 2, 3, 4, 5, and 6, a two-dimensional simplification is used to draw these two rotation prisms.

As shown in FIG. 5A, in one embodiment, the diffracted light 452 having one or more of the higher/non-zeroth diffractive orders (for example the +1st and −1st diffractive orders), upon entering via input 414.1, may pass through a first portion of a partially reflective surface along channel BA, reflect one or more times within the interior of the self-referencing interferometer 414, and reach a second portion of the partially reflective surface along channel BA. Part of the diffracted light 452 which reflects off of the second portion of the partially reflective surface remain in channel BA and exit as output ray 456.2 at output 414.2, shown in FIG. 5D. The part of the diffracted light 452 which transmits through the second portion of the partially reflective surface continues into channel AA and exit as output ray 454.1 at output 414.3, shown in FIG. 5E.

The portion of the diffracted light 452 which was reflected off of the first portion of the partially reflective surface propagates along channel AB to one or more other reflective surfaces within the self-referencing interferometer 414. When part of the diffracted light 452 reaches the second portion of the partially reflective surface, part transmits through in channel AB and exits as output ray 456.1 at output 414.2. The part of the diffracted light 452 which reflects off of the second portion of the partially reflective surface enters channel BB and exits as output ray 454.2 at output 414.3. All together, as shown in FIGS. 5D and 5E, output rays 456.1 and 456.2 both exit through output 414.2 together as output beam 456 and output rays 454.1 and 454.2 both exit through output 414.3 together as output beam 454.

In FIG. 5C, only one diffracted order resulting from the alignment mark is shown in order to simplify these figures. Only one diffraction order is insufficient for interference and hence modulation of the alignment signal (at the detector) to take place. Typically in FIG. 5C, for each positive higher diffraction order an accompanying negative higher diffraction order is present at the 180 degrees rotated location. This accompanying negative higher diffraction order will result in an additional pair of beams in FIG. 5D which or at least partly overlap with the beams resulting from the accompanying positive higher diffraction order. The at least partly overlapping beams will result in interference, and hence an alignment mark position dependent (and also alignment mark shape dependent) modulation of the alignment signal.

In an embodiment, the optical path lengths of the different channels AB, BA, AA, and BB are approximately equal so there is no path length difference between each of them, since a path length difference can reduce the contrast of the alignment signal.

The partially reflective surface may be composed of a lossless mirror so as to avoid the possibility of heating, which could cause, among other things, a difference in path length between the different channels.

The channels AB and BA producing output beam 456 and the channels AA and BB producing output beam 454 may be characterized in terms of Jones matrices, assuming no losses and ideal phase behavior of reflections, coatings, etc., as depicted in equations 4 through 7:

$$E_{out,AA} = \frac{1}{\sqrt{2}} \cdot \underline{X}(90°) \cdot \begin{bmatrix} 1 & 0 \\ 0 & \exp(i \cdot \phi_{AA}) \end{bmatrix} \cdot \frac{1}{\sqrt{2}} \cdot E_{in} \quad (4)$$

$$E_{out,BB} = \frac{1}{\sqrt{2}} \cdot \underline{X}(-90°) \cdot \begin{bmatrix} \exp(i \cdot \phi_{BB}) & 0 \\ 0 & 1 \end{bmatrix} \cdot \frac{1}{\sqrt{2}} \cdot E_{in} \quad (5)$$

$$E_{out,AB} = \frac{1}{\sqrt{2}} \cdot \underline{X}(90°) \cdot \begin{bmatrix} 1 & 0 \\ 0 & \exp(i \cdot \phi_{AB}) \end{bmatrix} \cdot \frac{1}{\sqrt{2}} \cdot E_{in} \quad (6)$$

$$E_{out,BA} = \frac{1}{\sqrt{2}} \cdot \underline{X}(-90°) \cdot \begin{bmatrix} \exp(i \cdot \phi_{BA}) & 0 \\ 0 & 1 \end{bmatrix} \cdot \frac{1}{\sqrt{2}} \cdot E_{in} \quad (7)$$

Where the ideal different angular values (modulo two times pi) are for example given as follows:

$\phi_{AA}=0$ [deg]

$\phi_{BB}=0$ [deg]

$\phi_{AB}=180$ [deg]

$\phi_{BA}=180$ [deg]

Once the beams have exited the polarization neutral beam splitter, output beam 454 may be focused by lens 418. In an embodiment, the lens 418 focuses the output beam 454 onto a fiber optic cable, for example a multimode fiber that collects the light from the different diffraction orders. The fiber optic cable may transmit the collected light to detector 420. The detector 420 detects alignment signals contained within the output beam 454. It is to be appreciated that other types of optical transmission and/or detection are available as will be recognized by those skilled in the relevant art(s). Alternatively, the output beam 454 may be focused directly to the detector 420.

In one example, detector 420 may represent multiple detectors, such as a separate detector dedicated to each particular wavelength or range of wavelengths of light. In such an embodiment, the different wavelengths existing within the output beam 454 may be split just before reaching the separate dedicated detectors. In this manner, different wavelength ranges are detected, such as a range from approximately 500 nanometers to 900 nanometers. This may be accomplished, for example, by 16 wavelength resolving detectors operating together as the detector 420. In an embodiment, the detector 420 may include one or more photo detectors, such as a CCD or CMOS array, or discrete pin detectors per channel. One or more multimode fibers may be used to relocate detector 420 to a favorable mounting position. Other types and amounts of detectors and/or fibers are possible, as will be recognized by those skilled in the relevant art(s).

In similar manner, the output beam 456 may be focused by lens 416 to either a fiber optic cable or directly to a detector 422, where the detector 422 may be configured in like manner to the detector 420.

The output beams 454 and 456 contain alignment signals that have information regarding the position of the mark 408. In an embodiment, the intensity of the output beams 454 and 456 is detected and determined in a plurality of different positions in the pupil plane, image plane, or a plane in between the pupil and image planes, where the output beams 454 and 456 overlap and interfere. In this manner, the alignment sensor of FIG. 4 generates an alignment signal irrespective of the polarization of the light coming from the mark 408 in comparison to prior systems such as that shown in FIG. 2. Further, the use of a polarization independent interferometer according to the various embodiments may increase marker rotation and sub-segmentation flexibility. In one example, this added flexibility arises because the polarization returned in the diffracted light is no longer important to obtaining the end result. It also becomes possible to use more varied illumination polarizations, optimizing for example repro, contrast, diffraction efficiency, alignment mark asymmetry sensitivity, etc.

Figure 6:
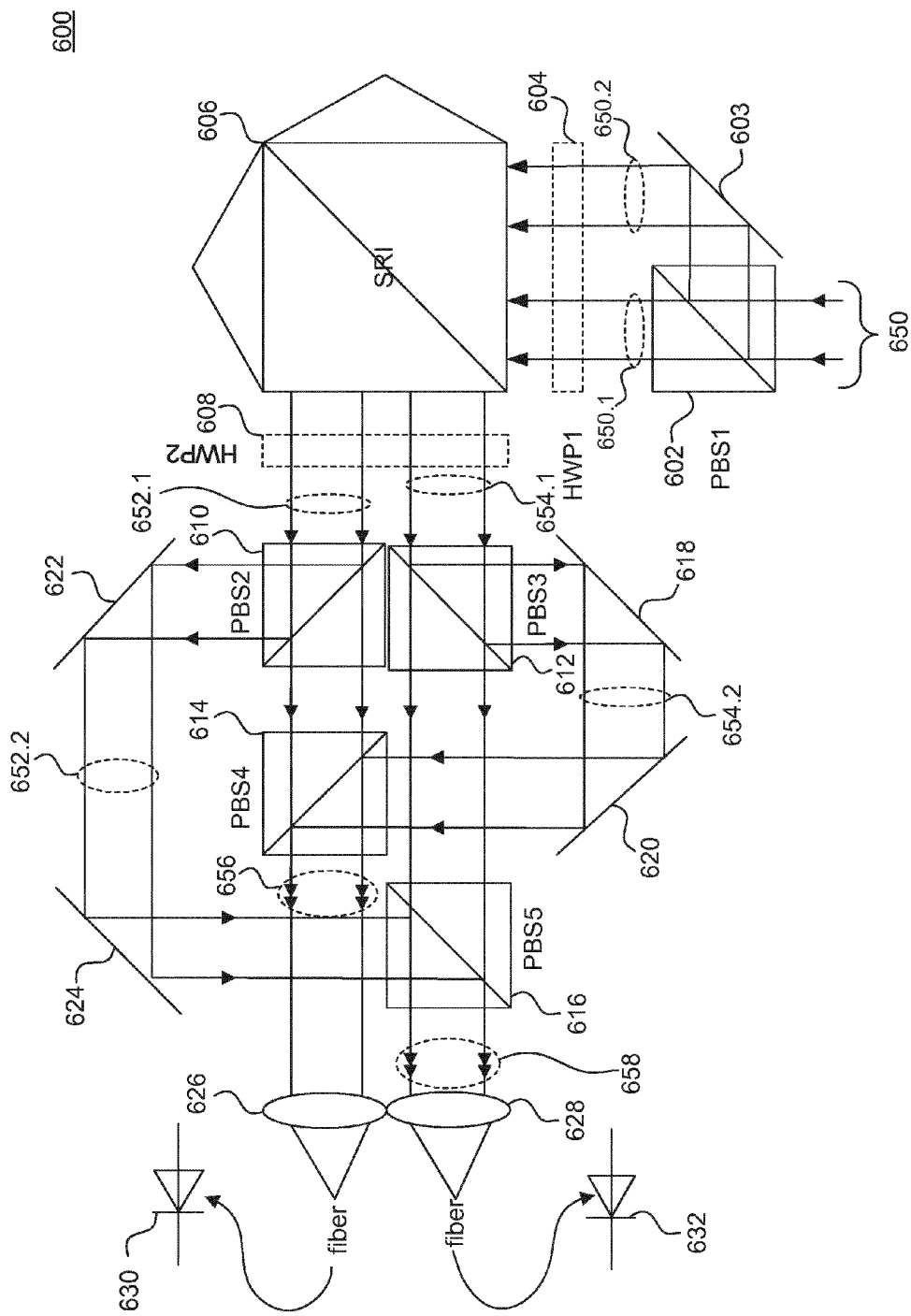
FIG. 6 is a schematic illustration of a polarization independent interferometer according to a second embodiment of the invention.

FIG. 6 illustrates a schematic illustration of a polarization independent interferometer system 600 according to a second embodiment. In one example, system 600 is not subject to the same limitations in polarization as the interferometer of FIG. 2. System 600 can be used for determining alignment and/or overlay, as well as to determine alignment mark asymmetry and/or process variation information.

FIG. 6 schematically depicts the path light takes after diffracting from a mark to one or more sensors. After incidence upon a mark, the radiation beam B is diffracted or scattered as diffracted light 650. As discussed above and as recognized by those skilled in the relevant art(s), the radiation beam B may have polarization of any state without loss of contrast. As discussed above with respect to FIG. 2, diffracted light 650 may include multiple diffraction orders, such as the higher/non-zeroth diffractive orders (for example the +1st and −1st diffractive orders), of any polarization or state. This may include, for example, elliptically polarized light, linearly polarized light, circularly polarized light, partially polarized light, or unpolarized light. The 0th order may be blocked to prevent interference with the depth of modulation of any detected signal, such as by a stop (not shown in FIG. 6) which only allows the diffracted light 650 that composes the +higher/non-zeroth diffractive orders (for example the +1st and −1st diffractive orders).

In one example, the diffracted light 650 may enter a first polarizing beam splitter 602. In an embodiment, the first polarizing beam splitter 602 may split the diffracted light into first and second polarized beams 650.1 and 650.2. As will be recognized by those skilled in the relevant art(s), first and second polarized beams 650.1 and 650.2 may each include multiple beams, for example at least the beams corresponding to the higher/non-zeroth diffractive orders (for example the +1st and −1st diffractive orders) of the diffracted light 650. The higher/non-zeroth diffractive orders (for example the +1st and −1st diffractive orders) may be, for example, in a 180° rotationally symmetric configuration. Optionally, one or both of first and second polarized beams 650.1 and 650.2 may then pass through a half wave plate 604, which in cooperation with optional half wave plate 608 can further polarize the beams, for example at 45 and 135 degrees. Other polarizations are possible, as will be recognized by those skilled in the relevant art(s).

In one example, the first and second polarized beams 650.1 and 650.2 enter first and second inputs, respectively, of a self-referencing interferometer 606. The self-referencing interferometer 606 may have, or use, more or fewer inputs or outputs than two as will be recognized by those skilled in the relevant art(s). Further, the self-referencing interferometer 606 may alternatively be replaced by two self-referencing interferometers, where each self-referencing interferometer receives one of first and second polarized beams 650.1 and 650.2, as shown by self-referencing interferometers 706.1 and 706.2 in FIG. 7, discussed in more detail below. The first and second polarized beams 650.1 and 650.2 exit the self-referencing interferometer 606 from respective first and second exit outputs (not shown) as exit beams 652.1 and 654.1. As shown in FIG. 6, exit beams 652.1 and 654.1 each include the higher/non-zeroth diffractive orders (for example the +1st and −1st diffractive orders) of the diffracted light 650 as modified by the self-referencing interferometer 606, such that each positive diffraction order at least partially overlaps with its corresponding negative diffraction order. Optionally, as discussed above, the exit beams 652.1 and 654.1 may pass through another half-wave plate 608, although such is not required according to embodiments of the present disclosure.

Upon exiting an output of the self-referencing interferometer 606, the exit beam 652.1 may enter a second polarizing beam splitter 610, which splits part of the exit beam 652.1 to form exit beam 652.2. In one example, the split exit beam 652.2 traverses a different optical path than exit beam 652.1, being redirected for example by two reflective surfaces 622 and 624. These reflective surfaces may be, for example, mirrors. Similarly, upon exiting an output of the self-referencing interferometer 606, the exit beam 654.1 may enter a third polarizing beam splitter 612, which splits part of the exit beam 654.1 to form exit beam 654.2. In one example, the split exit beam 654.2 traverses a different optical path than exit beam 654.1, being redirected for example by two reflective surfaces 618 and 620. As will be recognized by those skilled in the relevant art(s), more or fewer than two reflective surfaces may be used to redirect the split exit beams 652.2 and 654.2 as desired for the system. In addition or alternatively, the exit beams 652.1 and 654.1 may be redirected along a different optical path from their original exit paths from self-referencing interferometer 606.

In one example, split exit beam 654.2 and exit beam 652.1, after redirection of one or both beams along different optical paths, both enter a fourth polarizing beam splitter 614, which may combine the two beams into a first combined exit beam 656.

In an embodiment, the mechanical and optical coating tolerances of the self-referencing interferometer 606 may be kept small to minimize the size of optical path length differences, as compared to the wavelength used, of the individual beams (e.g. 454.1 and 454.2 or 456.1 and 456.2) of the combined exit beams 654.1 and 652.1. If the optical path length differences are not kept small, contrast loss of the resulting alignment signals may result. As will be recognized, the first combined exit beam 656 may still include the higher/non-zeroth diffractive orders (for example the +1st and −1st diffractive orders), or more or fewer diffractive orders, diffracted or scattered from the mark on the substrate. The first combined exit beam 656 may be focused by lens 626 onto, for example, a fiber optic cable that collects the light from the different diffraction orders and transmits the collected light to detector 630. Alternatively, the first combined exit beam 656 may be focused directly to the detector 630. The detector 630 may detect one or more wavelengths with one or more dedicated detectors, as discussed above with respect to FIG. 4.

In one example, split exit beam 652.2 and exit beam 654.1, after redirection of one or both beams, both enter a fifth polarizing beam splitter 616, which may combine the two beams into a second combined exit beam 658. The second combined exit beam 658 may include the higher/non-zeroth diffractive orders (for example the +1st and −1st diffractive orders), or more or fewer diffractive orders, diffracted or scattered from the mark on the substrate. The second combined exit beam 658 may be focused by lens 628 onto a fiber optic cable and transmitted to detector 632. Different types of transport and detection of the second combined exit beam 658 are possible, as discussed above with respect to FIG. 4. In an embodiment, the detectors 630 and 632 may be separate detector arrays dedicated to each different combined exit beam. Alternatively, the detectors 630 and 632 may be a combined array at a centralized location which may receive the different combined exit beams at different locations on the combined array. In either alternative, the detectors 630 and 632 may separate and separately detect the different wavelengths in the first and second combined exit beams 656 and 658, respectively.

The first and second combined exit beams 656 and 658 may contain alignment signals which have information regarding the position of the mark on the substrate. In an embodiment, the intensity of the first and second combined exit beams 656 and 658 is detected and determined in a plurality of different positions in the plane where the images in the first and second combined exit beams 656 and 658 overlap and interfere. In this manner, the alignment sensor of system 600 may capture all of the diffracted light, instead of just one mode as was the situation in prior systems such as that shown in FIG. 2.

Figure 7:
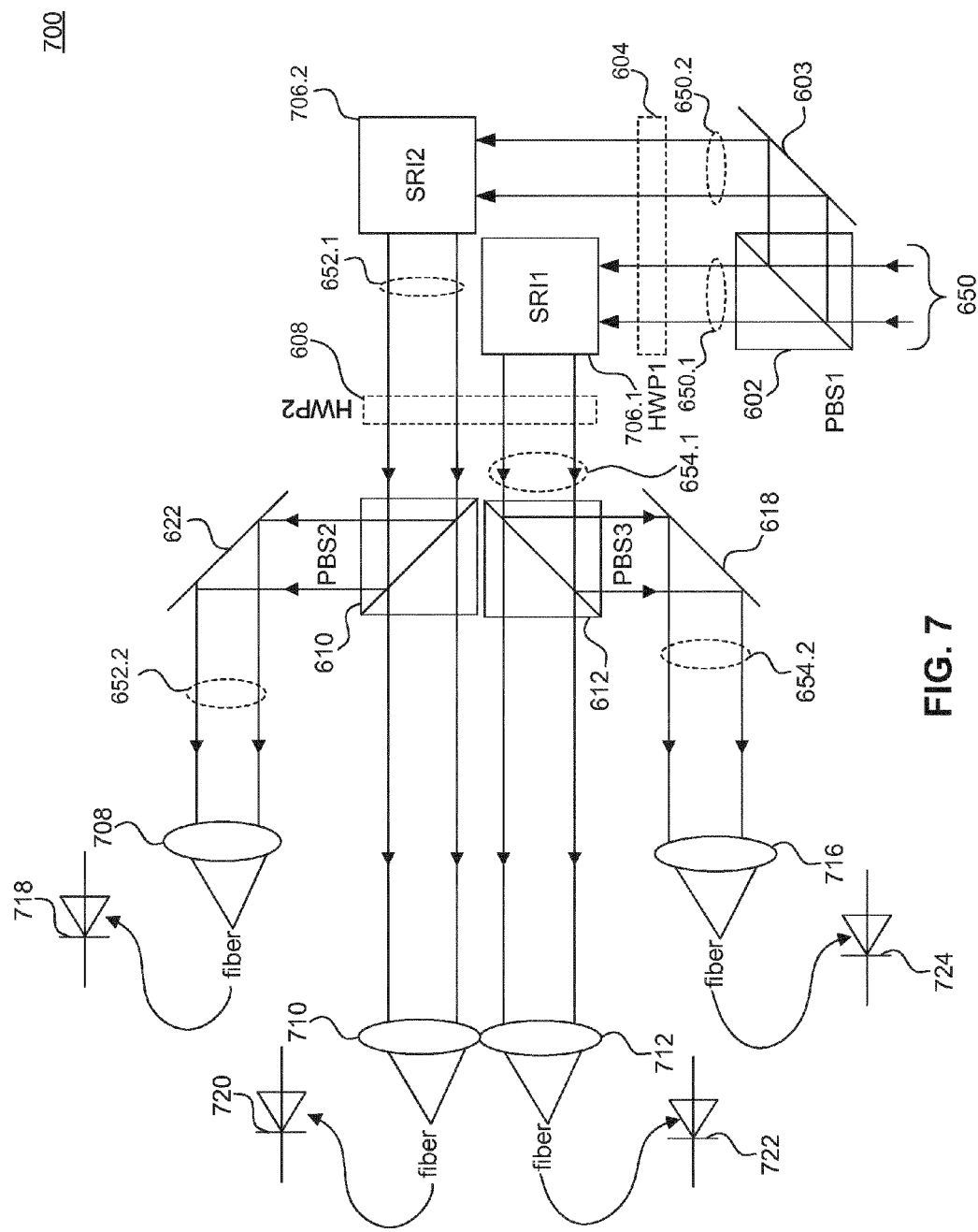
FIG. 7 is a schematic illustration of a polarization independent interferometer according to a third embodiment of the invention.

FIG. 7 illustrates a schematic illustration of a polarization independent interferometer system 700 according to a third embodiment. System 700 may not be subject to the same limitations in polarization as the interferometer of FIG. 2. System 700 may be used for determining alignment and/or overlay, as well as to determine alignment mark asymmetry and/or process variation information. Several features of FIG. 7 are shared in common with FIG. 6. For sake of simplicity, only those elements that differ from those discussed above with respect to FIG. 6 will be discussed.

In one example, the first and second polarized beams 650.1 and 650.2 enter corresponding inputs of a first self-referencing interferometer 706.1 and a second self-referencing interferometer 706.2. The self-referencing interferometers 706.1 and 706.2 may each have, or use, more inputs and/or outputs than just one as will be recognized by those skilled in the relevant art(s). By using a separate first self-referencing interferometer 706.1 for first polarized beam 650.1 with respect to second self-referencing interferometer 706.2 for second polarized beam 650.2, cross talk may be avoided. Although cross talk may occur between signals in a self-referencing interferometer that includes and uses two inputs exists, it is typically sufficiently small and therefore a minor issue. If cross talk were a larger factor, it could lead to contrast loss of the resulting alignment signals. Despite the risk of cross talk, the self-referencing interferometers 706.1 and 706.2 may alternatively be replaced by a single self-referencing interferometer, as discussed with respect to FIG. 6 above.

In contrast to the alignment sensor of system 600 shown in FIG. 6, the alignment sensor of system 700 of FIG. 7 does not include the fourth and fifth polarizing beam splitters 614 and 616. Instead, the split exit beam 652.2 is directed towards lens 708, which may focus and transmit the split exit beam 652.2 toward detector 718. Similarly, split exit beam 654.2 may be directed towards lens 716, which may focus and transmit the split exit beam 654.2 toward detector 724. Exit beams 652.1 and 654.1 may, instead of being combined with the split exit beams 652.2 and 654.2, be individually detected as well. For example, lens 710 may focus and transmit exit beam 652.1 toward detector 720 and lens 712 may focus and transmit exit beam 654.1 toward detector 722. As discussed above, exit beams 652.1, 654.1 and split exit beams 652.2, 654.2 may traverse different optical paths than that depicted in FIG. 7 while being conveyed to their respective detectors, as will be recognized by those skilled in the relevant art(s).

As a result of this configuration in FIG. 7, the alignment sensor of system 700 may image the four outputs of the second and third polarizing beam splitters 610 and 612 directly or indirectly onto four respective detectors 718, 720, 722, and 724. As discussed above, the detectors 718, 720, 722, and 724 may each detect one or more wavelengths with one or more dedicated detectors/detector arrays, as discussed above with respect to FIGS. 4 and 6.

Laser noise normalization, reduction, or suppression, may also be applied to the signals detected at the detectors 718, 720, 722, and 724. Normalization is a known technique for laser noise reduction, as described in U.S. Pat. No. 8,446,564, incorporated by reference herein in its entirety. In an embodiment, a frequency transformation such as a Fourier transformation may be applied for normalization and noise reduction. Laser noise normalization may be performed on the output from the detector pairs 718 and 720 and 722 and 724, for example:

$$I_{align,one} = \frac{I_{718} - I_{720}}{I_{718} + I_{720}}$$

$$I_{align,two} = \frac{I_{722} - I_{724}}{I_{722} + I_{724}},$$

In these equations, $I_{align,one}$ denotes the noise normalized alignment signal for the measured alignment signals $I_{718}$ and $I_{720}$ while $I_{align,two}$ denotes the noise normalized alignment signal for the measured alignment signals $I_{722}$ and $I_{724}$.

Exemplary Method of Operation

Figure 8:
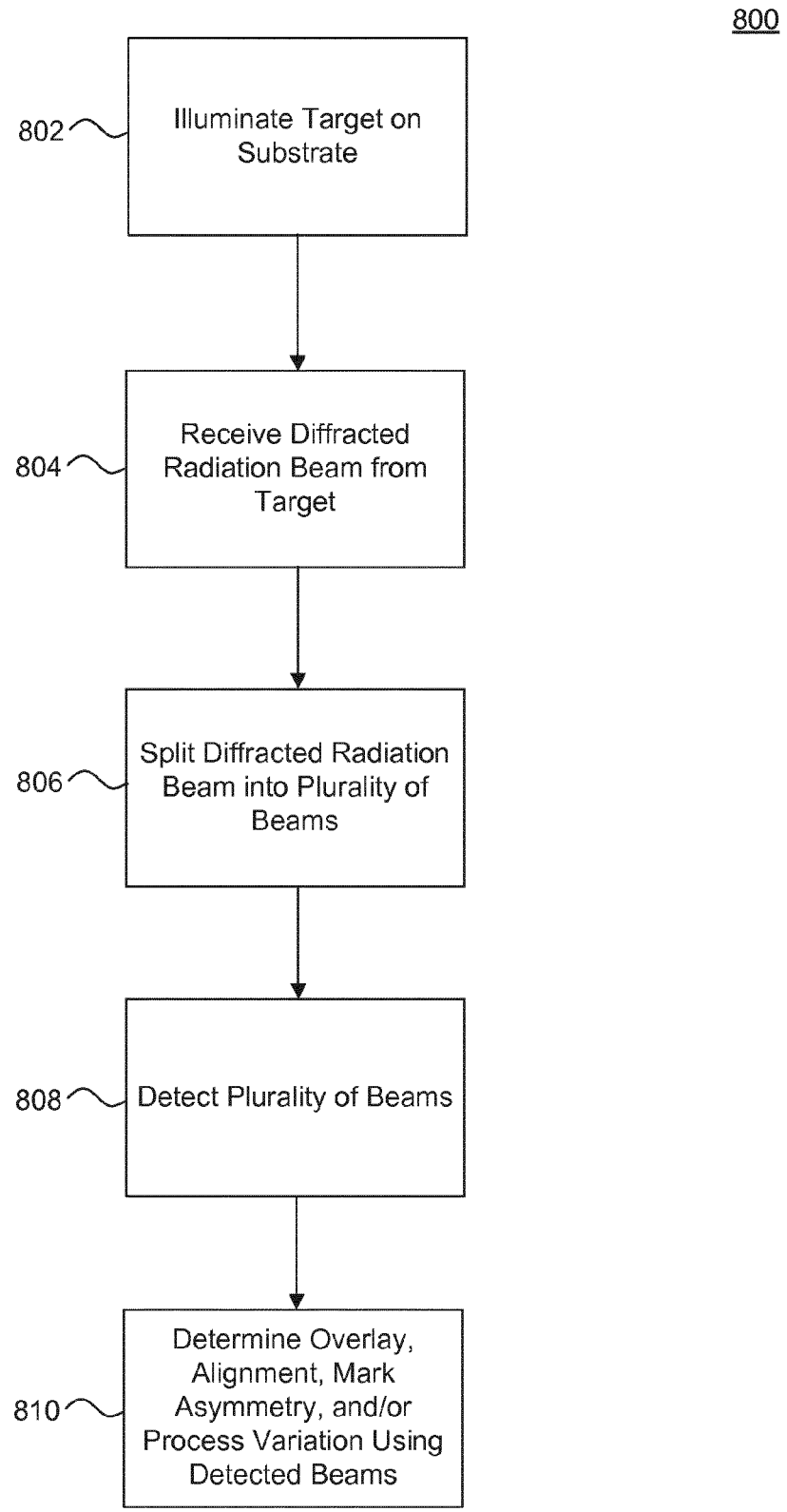
FIG. 8 is a flow diagram of a method of detecting diffracting or scattered radiation having any polarization or state according to an embodiment of the invention.

FIG. 8 is a flow diagram of a method 800 according to an embodiment. For example, method 800 may be used for detecting diffracted or scattered radiation having any polarization or state. It is to be appreciated that not all operations shown may be required, or performed, in the order shown. Method 800 will be described with respect to one or more systems described above for convenience, but should not be seen as being limited to operating using these systems.

The method begins at step 802, when a beam of radiation, such as radiation beam B illuminates a target, for example mark 408, on a substrate W. In an embodiment, the radiation beam B may have polarization of any angle and/or state.

At step 804, light from the radiation beam B may be scattered or diffracted and received by an alignment sensor system, such as any one of the polarization independent interferometer systems discussed above. As will be recognized by those skilled in the relevant art(s), multiple diffraction orders, for example the higher/non-zeroth diffractive orders (for example the +1st and −1st diffractive orders), with the 0th order blocked, may be received by the system.

At step 806, the diffracted light may be split into a plurality of beams. In one embodiment, the diffracted light may be split by a polarization neutral beam splitter, such as a polarization neutral beam splitter used in the self-referencing interferometer 414 depicted in FIG. 4. In an alternative embodiment, the diffracted light may be split by a polarizing beam splitter and directed toward one or more self-referencing interferometers, such as self-referencing interferometer 606 in FIG. 6 or self-referencing interferometers 706.1 and 706.2 in FIG. 7. In embodiments involving one or more self-referencing interferometers, the plurality of beams may themselves be split up further and/or recombined, for example as shown in FIGS. 6 and 7 above. Further, each beam among the plurality of beams may be additionally split up by wavelength for detection in any of the embodiments.

At step 808, one or more detectors may detect a plurality of beams that resulted from the splitting done at step 806. Detector 420 may represent multiple detectors, such as a separate detector dedicated to one particular wavelength, range of wavelengths, or different spectral weighing of intensity of light. Signal processing may also be performed on the signals representing the detected plurality of beams. This signal processing may be performed to suppress measurement noise, such as illumination intensity noise. Signal processing may be performed as part of step 808 or as an additional step, as will be recognized by those skilled in the relevant art(s).

At step 810, the polarization independent interferometer system may determine an overlay and/or alignment of a feature of the substrate using the information within the alignment signals detected by the one or more detectors at step 808. The polarization independent interferometer system may additionally or alternatively determine information regarding the alignment mark asymmetry and/or process. In an embodiment, the intensity of the beams may be detected in a plurality of different positions in the pupil plane, image plane, or in a plane in between the pupil plane and the image plane, where the images overlap and interfere. In this manner, the polarization independent interferometer system may capture all of the diffracted light, instead of just one mode. The information produced at step 810 may be useful to locate and correct any hardware and/or software that may cause misalignment of different features being patterned on the substrate. The method 800 subsequently ends.

Figure 9:
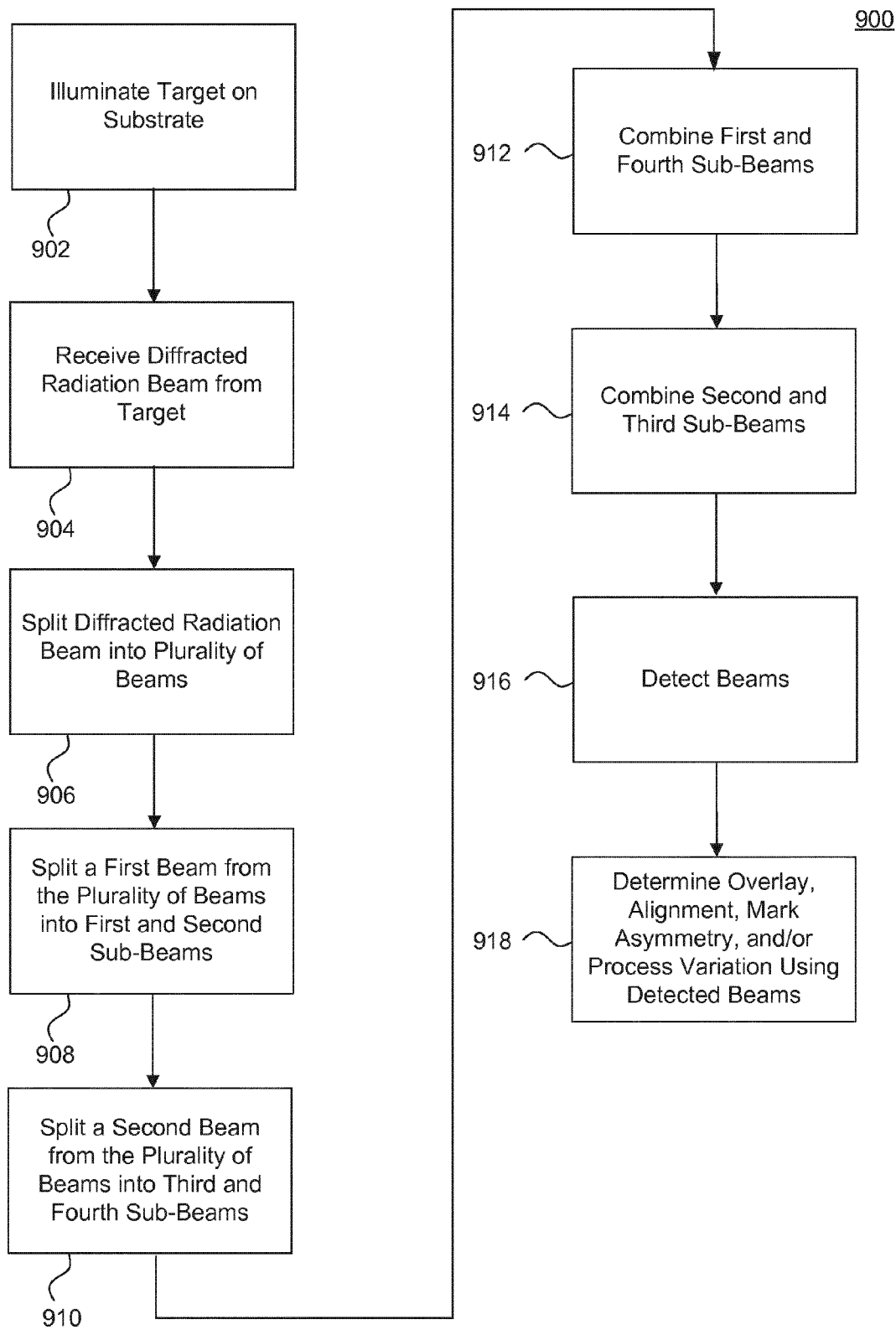
FIG. 9 is a flow diagram of a method of detecting diffracting or scattered radiation having any polarization or state according to an alternative embodiment of the invention.

FIG. 9 is a flow diagram of a method 900, according to an alternative embodiment of the invention. In one example, method 900 can be used for detecting diffracted or scattered radiation having any polarization or state. It is to be appreciated that not all operations shown may be require, or performed in the order shown. Method 900 will be described with respect to one or more systems described above for convenience, but should not be seen as being limited to operating using these systems.

In an embodiment, method 900 may be an exemplary method of the operation of the polarization independent interferometer system 600 of FIG. 6. As with method 800, the mark on the substrate is first illuminated with a radiation beam B at step 902.

At step 904, the polarization independent interferometer system may receive the light diffracted or scattered from the mark on the substrate.

At step 906, the diffracted light may be split into a plurality of beams, for example by the first polarizing beam splitter 602 in FIG. 6, and directed toward one or more self-referencing interferometers, such as self-referencing interferometer 606 in FIG. 6 or self-referencing interferometers 706.1 and 706.2 in FIG. 7. A first diffracted beam and a second diffracted beam may result from the splitting at step 906. A separate channel in a single self-referencing interferometer that includes two inputs and two outputs, or one channel in as many self-referencing interferometers as there are split diffracted beams, for example two, may process each beam.

At step 908, after traversing a self-referencing interferometer, the first diffracted beam may be split again by a second polarizing beam splitter into first and second split beams, described as sub-beams for purposes of discussion here, such as beams 652.1 and 652.2 in FIG. 6. At step 910, the second diffracted beam may be split by a third polarizing beam splitter into third and fourth sub-beams, such as beams 654.1 and 654.2 in FIG. 6. Steps 908 and 910 may occur at the same or different times, as will be recognized by those skilled in the relevant art(s).

At step 912, the first and fourth sub-beams may be combined by a fourth polarizing beam splitter to form a first composite, or combined, beam that still may contain at least the higher/non-zeroth diffractive orders (for example the +1st and −1st diffractive orders) of the light originally diffracted from the mark on the substrate. At step 914, the second and third sub-beams may be combined by a fifth polarizing beam splitter to form a second composite, or combined, beam that also may still contain at least the higher/non-zeroth diffractive orders (for example the +1st and −1st diffractive orders) of the diffracted light. Steps 912 and 914 may occur at the same or different times, as will be recognized by those skilled in the relevant art(s).

At step 916, the first composite beam and the second composite beam may be detected by one or more detectors in a plurality of different positions where the images overlap and interfere, as discussed above. Each composite beam may contain alignment information regarding the mark which diffracted or scattered the incident radiation beam B. In this manner, the outputs of the interferometer(s) may be combined in the intensity space before detection by the one or more detectors of the detector sub-system. Signal processing may also be performed on the signals representing the detected composite beams. This signal processing may be performed to suppress measurement noise, such as illumination intensity noise. Signal processing may be performed as part of step 916 or as an additional step, as will be recognized by those skilled in the relevant art(s).

At step 918, the intensity of the detected beams may be used to determine the overlay and/or alignment of the mark that caused the diffraction. The polarization independent interferometer system may thereby capture all of the diffracted light, instead of just one mode. The method 900 subsequently ends.

Figure 10:
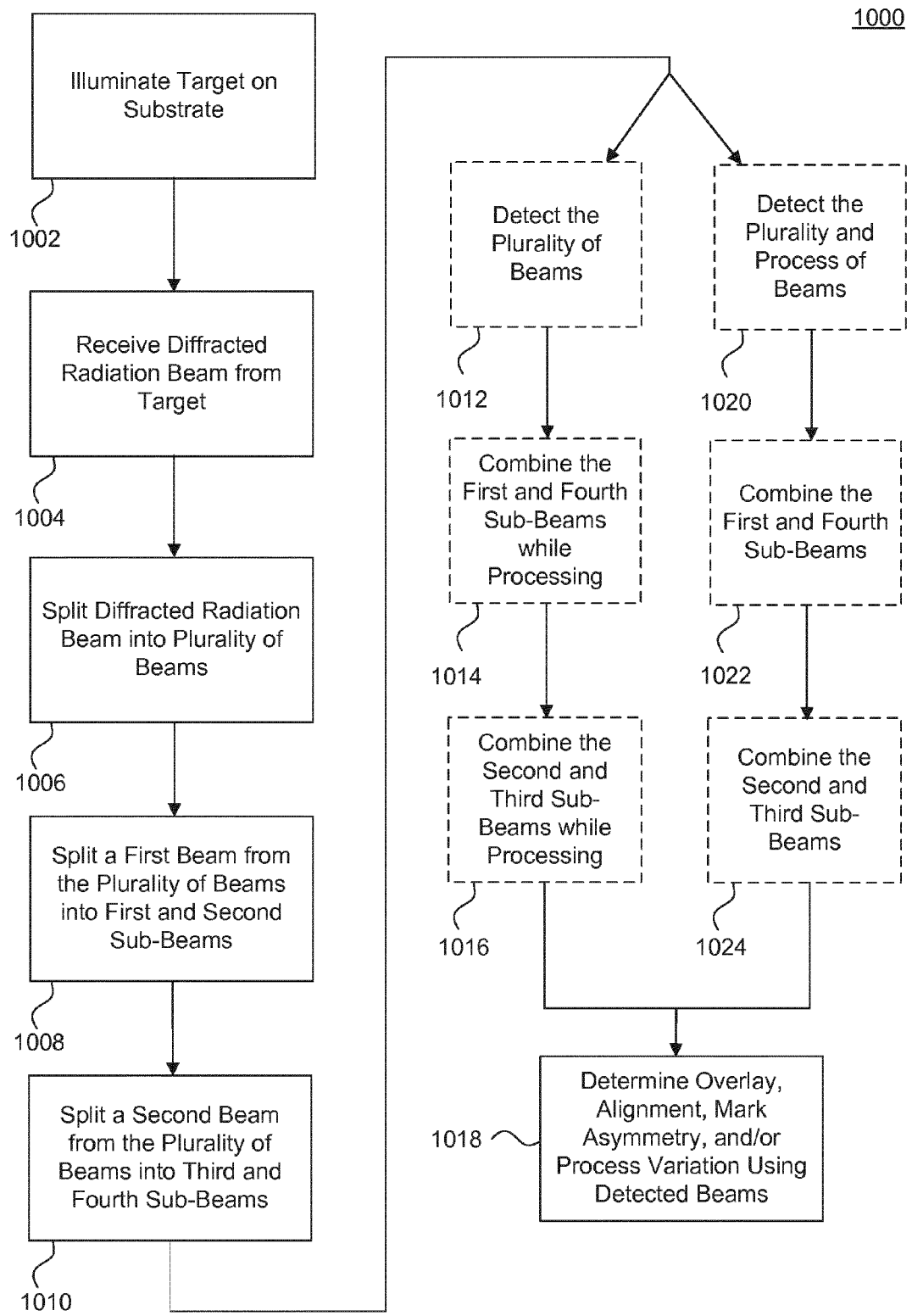
FIG. 10 is a flow diagram of a method of detecting diffracting or scattered radiation having any polarization or state according to an alternative embodiment of the invention.

FIG. 10 is a flow diagram of a method 1000, according to another alternative embodiment of the invention. In one example, method 1000 can be used for detecting diffracted or scattered radiation having any polarization or state. It is to be appreciated that not all operations shown may be required, or performed, in the order shown. Method 1000 will be described with respect to one or more systems described above for convenience, but should not be seen as being limited to operating using these systems.

In an embodiment, method 1000 may be an exemplary method of the operation of the polarization independent interferometer system 700 of FIG. 7. As with methods 800 and/or 900, the mark on the substrate is first illuminated with a radiation beam B at step 1002.

At step 1004, the polarization independent interferometer system may receive the light diffracted or scattered from the mark on the substrate.

At step 1006, the diffracted light may be split into a plurality of beams, for example by the first polarizing beam splitter 602 in FIG. 6, and directed toward one or more self-referencing interferometers, such as self-referencing interferometer 606 in FIG. 6 or self-referencing interferometers 706.1 and 706.2 in FIG. 7. A first diffracted beam and a second diffracted beam result from the splitting at step 1006. A separate channel in a single self-referencing interferometer that includes two inputs and two outputs, or one channel in as many self-referencing interferometers as there are split diffracted beams, for example two, may process the beams.

At step 1008, after traversing a self-referencing interferometer, the first diffracted beam may be split again by a second polarizing beam splitter into first and second split beams, described as sub-beams for purposes of discussion here, such as beams 652.1 and 652.2 in FIG. 6.

At step 1010, the second diffracted beam may be split by a third polarizing beam splitter into third and fourth sub-beams, such as beams 654.1 and 654.2 in FIG. 6.

Steps 1008 and 1010 may occur at the same or different times, as will be recognized by those skilled in the relevant art(s).

Instead of optically combining the sub-beams as in method 900, method 1000 may separately detect the different sub-beams and combine the information obtained from each either during or after processing of the images. Signal processing may also be performed on the signals representing the detected sub-beams. This signal processing may be performed to suppress measurement noise, such as illumination intensity noise. Signal processing may be performed as part of step 1012 or 1020 or as an additional step, as will be recognized by those skilled in the relevant art(s). In a first embodiment, method 1000 may at step 1012 detect the plurality of sub-beams using one or more detectors and/or detector systems in a plurality of different positions where the images diffracted from the mark overlap and interfere, as discussed above.

After detection, at step 1014 the information from the first and fourth sub-beams may be combined during processing, instead of before or after.

Similarly, at step 1016 the information from the second and third sub-beams may be combined during processing.

Steps 1014 and 1016 may occur at the same or different times, as will be recognized by those skilled in the relevant art(s). In this manner, the outputs of the interferometer(s) may be combined, for example in the intensity space or in the position space after detection.

Alternatively, method 1000 may instead at step 1020 detect the plurality of sub-beams using one or more detectors and/or detector systems in a plurality of different positions where the images diffracted from the mark overlap and interfere, as discussed above, and proceed with processing the information contained within the detected beams.

After processing is completed in this alternative embodiment, at step 1022 method 1000 may then combine the information obtained from the detected first and fourth sub-beams.

Similarly, method 1000 may then combine the information obtained from the detected second and third sub-beams at step 1024.

Steps 1022 and 1024 may occur at the same or different times, as will be recognized by those skilled in the relevant art(s). In this manner, the outputs of the interferometer(s) may be combined in the position space after detection and processing.

After processing in either embodiment, method 1000 proceeds to step 1018, where the intensity of the detected and processed sub-beams may be used to determine the overlay and/or alignment of the mark that caused the diffraction. In this manner, the polarization independent interferometer system may capture all of the diffracted light, instead of just one mode. The method 1000 may then end.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus comprising:
an illumination system configured to condition a radiation beam;
a substrate table configured to hold a substrate, the substrate comprising a mark;
a projection system configured to project the radiation beam onto the substrate; and
an optical system configured to receive a diffracted or scattered radiation beam from the mark along an optical path passing through the optical system and to output first and second beams, the optical system comprising:
an interferometeric sub-system located along the optical path and comprising a beam splitter configured to split the diffracted or scattered radiation beam to form the first and second beams, wherein the beam splitter comprises a substantially polarization-neutral beam splitter that does not significantly affect polarization of the diffracted or scattered radiation beam, and
a detector sub-system configured to detect respective first and second alignment signals containing information on a position of the mark based on the first and second beams.

2. The lithographic apparatus of claim 1, wherein the substantially polarization-neutral beam splitter comprises:
a first input configured to receive the diffracted or scattered radiation beam;
a first output configured to output a first composite beam that comprises the first beam; and
a second output configured to output a second composite beam that comprises the second beam, wherein the detector sub-system comprises a first detector configured to detect the first composite beam and a second detector configured to detect the second composite beam.

3. The lithographic apparatus of claim 2, further comprising:
a linear polarizer configured to receive the radiation beam from a radiation source and output a linearly polarized beam;
a quarter wave polarizer configured to receive the linearly polarized beam and output a circularly polarized beam along an axis of the optical path; and
a lens configured to project the circularly polarized beam onto the mark on the substrate and receive the diffracted or scattered radiation beam from the mark.

4. The lithographic apparatus of claim 2, further comprising an aperture stop configured to block a zeroth diffraction order of the diffracted or scattered radiation beam.

5. The lithographic apparatus of claim 1, wherein:
the optical system comprises a first polarizing beam splitter configured to separate the diffracted or scattered radiation beam into a first polarized beam and a second polarized beam, the second polarized beam having a different polarization than the first polarized beam; and
the interferometeric sub-system is further configured to receive the first and second polarized beams and output respective first and second composite beams based on corresponding ones of the first and second polarized beams, the first composite beam comprising the first beam and the second composite beam comprising the second beam.

6. The lithographic apparatus of claim 5, further comprising:
a second polarizing beam splitter configured to separate the first composite beam into third and fourth composite beams; and
a third polarizing beam splitter configured to separate the second composite beam into fifth and sixth composite beams.

7. The lithographic apparatus of claim 6, wherein the detector sub-system further comprises:
first and second detectors configured to respectively detect the first and second alignment signals, the first and second alignment signals containing information on the position of the mark based on the third and fourth composite beams;
third and fourth detectors configured to detect respective third and fourth alignment signals containing information on the position of the mark based on the fifth and sixth composite beams; and
a processor configured to determine at least one of overlay, alignment, mark asymmetry, and process variation based on the information obtained from the first, second, third, and fourth alignment signals.

8. The lithographic apparatus of claim 6, further comprising:
a fourth polarizing beam splitter configured to combine the fourth and fifth composite beams to form a first combined beam; and
a fifth polarizing beam splitter configured to combine the third and sixth composite beams to form a second combined beam,
wherein the detector subsystem further comprises first and second detectors configured to respectively detect the first and second alignment signals based on the first and second combined beams; and a processor configured to determine at least one of overlay, alignment, mark asymmetry, and process variation based on the information obtained from the first and second alignment signals.

9. An alignment sensor, comprising:
an optical system configured to receive a diffracted or scattered radiation beam having any polarization from a surface of a substrate along an optical path passing through the optical system and to output first and second composite beams, the optical system comprising:
an interferometeric sub-system located along the optical path and comprising a substantially non-polarizing beam splitter that does not affect polarization of the diffracted or scattered radiation beam, the non-polarizing beam splitter being configured to split the diffracted or scattered radiation beam to form the first and second composite beams; and
a detector sub-system located along the optical path passing through the optical system and configured to detect respective first and second alignment signals containing information on the position of the mark based on the corresponding first and second composite beams.

10. The alignment sensor of claim 9, further comprising:
a linear polarizer configured to receive a beam from a radiation source and output a linearly polarized beam;
a quarter wave polarizer configured to receive the linearly polarized beam and output a circularly polarized beam along an axis of the optical path; and
a lens configured to project the circularly polarized beam onto the surface of the substrate and receive the diffracted or scattered radiation beam from the substrate.

11. The alignment sensor of claim 9, further comprising an aperture stop configured to block a zeroth diffraction order of the diffracted or scattered radiation beam.

12. The alignment sensor of claim 9, wherein:
the substantially non-polarizing beam splitter comprises a first input configured to receive the diffracted or scattered radiation beam, a first output configured to output the first composite beam, and a second output configured to output the second composite beam; and
the detector sub-system comprises a first detector configured to detect the first composite beam and a second detector configured to detect the second composite beam.

13. An alignment sensor, comprising:
an optical system configured to receive a diffracted or scattered radiation beam from a mark on a substrate, the optical system comprising:
a first polarizing beam splitter configured to separate the diffracted or scattered radiation beam into a first polarized beam and a second polarized beam different than the first polarized beam;
an interferometeric sub-system located along an optical path passing through the optical system and configured to receive the first and second polarized beams and output respective first and second composite beams based on the corresponding first and second polarized beams; and
a detector sub-system located along the optical path passing through the optical system and configured to detect respective first and second alignment signals containing information on a position of the mark based on the first and second composite beams.

14. The alignment sensor of claim 13, further comprising:
a second polarizing beam splitter configured to separate the first composite beam into third and fourth composite beams; and
a third polarizing beam splitter configured to separate the second composite beam into fifth and sixth composite beams.

15. The alignment sensor of claim 14, wherein the detector sub-system further comprises:
first and second detectors configured to respectively detect the first and second alignment signals, the first and second alignment signals containing information on the position of the mark based on the third and fourth composite beams;
third and fourth detectors configured to detect respective third and fourth alignment signals containing information on the position of the mark based on the fifth and sixth composite beams; and
a processor configured to determine at least one of overlay, alignment, mark asymmetry, and process variation based on the information obtained from the first, second, third, and fourth alignment signals.

16. The alignment sensor of claim 14, further comprising:
a fourth polarizing beam splitter configured to combine the fourth and fifth composite beams to form a first combined beam; and
a fifth polarizing beam splitter configured to combine the third and sixth composite beams to form a second combined beam.

17. The alignment sensor of claim 16, wherein the detector subsystem further comprises:
first and second detectors configured to respectively detect the first and second alignment signals based on the first and second combined beams; and
a processor configured to determine at least one of overlay, alignment, mark asymmetry, and process variation based on the information obtained from the first and second alignment signals.

* * * * *